(12) United States Patent
Oosawa et al.

(10) Patent No.: US 7,666,747 B2
(45) Date of Patent: Feb. 23, 2010

(54) PROCESS OF MANUFACTURING SEMICONDUCTOR DEVICE

(75) Inventors: Keisuke Oosawa, Miyagi (JP); Hideyuki Ando, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 91 days.

(21) Appl. No.: 11/509,652

(22) Filed: Aug. 25, 2006

(65) Prior Publication Data

US 2007/0048949 A1 Mar. 1, 2007

(30) Foreign Application Priority Data

Aug. 26, 2005 (JP) ............................. 2005-245876

(51) Int. Cl.
*H01L 21/336* (2006.01)
*H01L 21/04* (2006.01)
*H01L 21/00* (2006.01)

(52) U.S. Cl. ............... 438/297; 438/113; 438/460; 438/510; 438/513; 438/514; 438/527; 438/710; 438/33; 257/347; 257/758; 257/355; 257/E23.011; 257/E23.012; 257/E21.502; 257/E21.503; 257/E21.59; 257/E23.02

(58) Field of Classification Search ............... 438/600, 438/601, 113, 460, 510, 513, 514, 527, 710; 257/E21.502, E21.503, E21.59, E23.02, E23.011, 257/E23.012, 347, 758, 355
See application file for complete search history.

(56) References Cited

U.S. PATENT DOCUMENTS

| | | | | |
|---|---|---|---|---|
| 6,034,433 A | * | 3/2000 | Beatty | 257/758 |
| 6,433,403 B1 | * | 8/2002 | Wilford | 257/355 |
| 6,787,432 B2 | * | 9/2004 | Nagatomo | 438/462 |
| 6,847,096 B2 | | 1/2005 | Yanai et al. | |
| 6,849,929 B2 | * | 2/2005 | Naiki | 257/665 |
| 2005/0151194 A1 | * | 7/2005 | Chen et al. | 257/347 |

* cited by examiner

*Primary Examiner*—Charles D. Garber
*Assistant Examiner*—Leonard Chang
(74) *Attorney, Agent, or Firm*—Volentine & Whitt, P.L.L.C.

(57) ABSTRACT

A method that suppresses etching damage without increasing a chip area of a semiconductor device. An integrated circuit including a MOS transistor is formed in a device area, and a discharge diffusion region is formed in a device area, and a discharge diffusion region is formed in a grid area. The discharge diffusion region is connected to a metal wiring of the integrated circuit via a contact hole. Therefore, when the metal wiring is formed by a dry etching method, an electric charge stored in the metal wiring is discharged to a semiconductor substrate through the discharge diffusion region. Thus, etching damage of the MOS transistor is reduced. Since the discharge diffusion region and the contact hole are formed within the grid area, they are cut off by a dicing process, thus causing no increase in chip area of the semiconductor device.

2 Claims, 5 Drawing Sheets

(A)

(B)

(C)

(A)

(B)

PROCESS OF MANUFACTURING SEMICONDUCTOR DEVICE

BACKGROUND OF THE INVENTION

The present invention relates to a process for manufacturing a semiconductor device. More specifically, the present invention relates to a technique for suppressing etching damage at the time of formation of a wiring pattern using a dry etching method.

In a manufacturing process of a semiconductor device, field effect transistors are formed on a semiconductor substrate and thereafter a wiring process step for wiring these field effect transistors is performed.

In the present wiring process step, an insulating film is first deposited on the semiconductor substrate and a contact hole is formed in place with respect to the insulating film. Subsequently, a metal material for wiring is deposited within the contact hole and on the insulating film. Then, a metal material layer provided on the insulating film is patterned to thereby complete a wiring pattern. When a two-layer wiring is made, a second insulating film is further deposited on the insulating film, a through hole is defined therein, and a metal material is deposited thereon, and a metal material layer provided on the insulating film is patterned.

In general, a photolithography process is used for the patterning of the metal material layer. In the photolithography process, a resist film is applied onto the metal material layer and exposed in alignment with a wiring pattern to be formed. Thereafter, an exposure region or a non-exposure region of the resist film is removed, thereby forming a resist pattern. Then, the metal material layer is subjected to etching processing with the resist pattern as a mask, whereby a desired wiring pattern is obtained.

An etching processing technology is broadly divided into wet etching and dry etching (plasma etching or the like). The dry etching is inferior to the wet etching in that it is high in cost, whereas the dry etching is superior to the wet etching in that high-precision processing is enabled. Therefore, when a semiconductor device high in integration degree is manufactured, each wiring pattern is often formed using a dry etching technology.

However, the following drawbacks arise where each wiring pattern is formed using the dry etching technology.

When the wiring pattern is formed by the dry etching, an electric charge developed by the dry etching reaches a gate electrode through the inside of a contact hole and a lower wiring pattern and is stored in a gate insulating film. This storage of electric charge results in etching damage. The etching damage yields degradation in the characteristic of a field effect transistor, such as a variation in threshold voltage.

As a technique for suppressing the storage of an electric charge by dry etching, there has been known one described in, for example, a patent document 1 (Japanese Unexamined Patent Publication No. 2003-282570). In the present technique, a contact hole for making a floating conductive layer conductive to a semiconductor substrate is provided in a non-shot area (i.e., an area in which an integrated circuit pattern is not transferred in an exposure process) of a semiconductor wafer to thereby suppress the storage of the electric charge into the conductive layer (refer to, for example, FIG. 2 of the patent document 1).

In order to prevent the above-described storage of electric charge into the gate insulating film through the use of the technique described in the patent document 1, a contact hole for connecting a metal material layer for a wiring pattern and its corresponding semiconductor substrate may be formed.

However, the technique of the patent document 1 is accompanied by drawbacks that since the contact hole for discharging the stored electric charge is formed in the non-shot area, there is a need to add the exposure process and correspondingly the number of process steps increases, thus raising the cost of manufacturing.

On the other hand, since such a contact hole must be formed one by one or plural by plural for every wiring pattern, an increase in circuit scale becomes innegligible where an attempt is made to provide these contact holes in a device area (an area lying within a shot area, in which a semiconductor integrated circuit is formed). Thus, this results in trouble in terms of attainment of a reduction in chip area.

SUMMARY OF THE INVENTION

With the foregoing in view, it is an object of the present invention to suppress etching damage without increasing a chip area of a semiconductor device.

According to a first aspect of the present invention, for attaining the above object, there is provided a process for manufacturing a semiconductor device, comprising:

a first step for forming a field effect transistor in a device area of a surface of a semiconductor substrate and forming a discharge high-concentration impurity region in a grid area of the surface of the semiconductor substrate;

a second step for forming an intermediate insulating film over the semiconductor substrate;

a third step for forming, using a dry etching method, a wiring pattern which is connected to a gate electrode of the field effect transistor through a first contact hole provided in the intermediate insulating film placed over the device area and which is connected to the discharge high-concentration impurity region through a second contact hole provided in the intermediate insulating film placed over the grid area; and cutting off a boundary between the device area and the grid area.

According to a second aspect of the present invention, for attaining the above object, there is provided a semiconductor integrated circuit formed for every shot area of a semiconductor substrate, comprising:

a field effect transistor formed in a device area lying within the shot area;

a discharge high-concentration impurity region formed in a grid area lying within the shot area;

an intermediate insulating film formed over the semiconductor substrate;

a wiring pattern formed over the intermediate insulating film using a dry etching method;

a first interlayer wiring which connects a gate electrode of the field effect transistor and the wiring pattern via a first contact hole defined in the intermediate insulating film provided over the device area; and a second interlayer wiring which connects the discharge high-concentration impurity region and the wiring pattern via a second contact hole defined in the intermediate insulating film provided over the grid area.

According to the present invention, the discharge high-concentration impurity region and the second contact hole are formed in the grid area (area lying within the shot area, which is cut off after the formation of the integrated circuit). It is therefore possible to prevent etching damage without increasing a chip area of a finally-manufactured semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, the size, shape and physical relationship of each constituent element in the figures are merely approximate illustrations to enable an understanding of the present invention, and further the numerical conditions explained below are nothing more than mere examples.

First Preferred Embodiment

Figure 2:
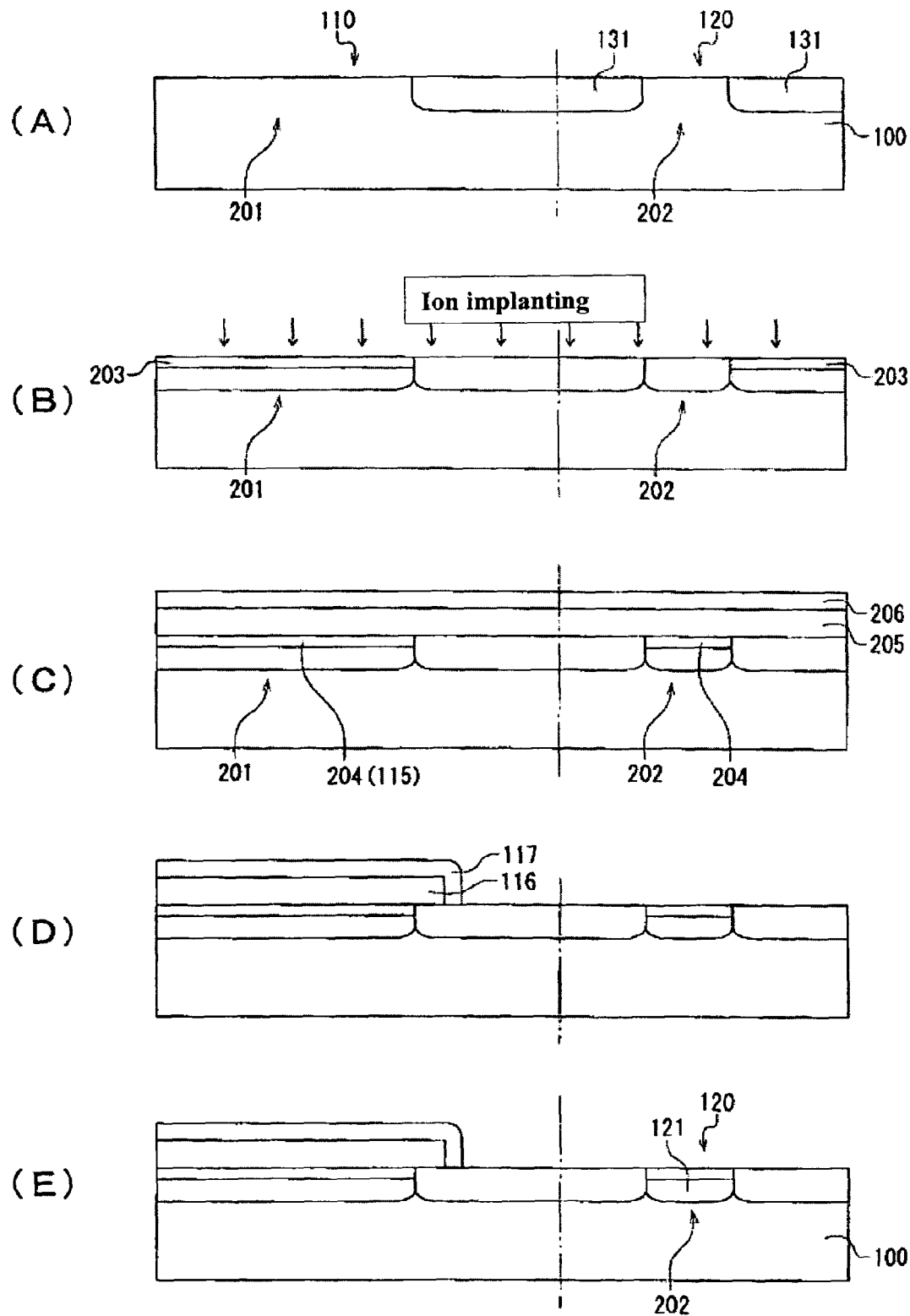
FIG. 2 is a process sectional view illustrating a manufacturing process of a semiconductor device according to the first embodiment.
Figure 3:
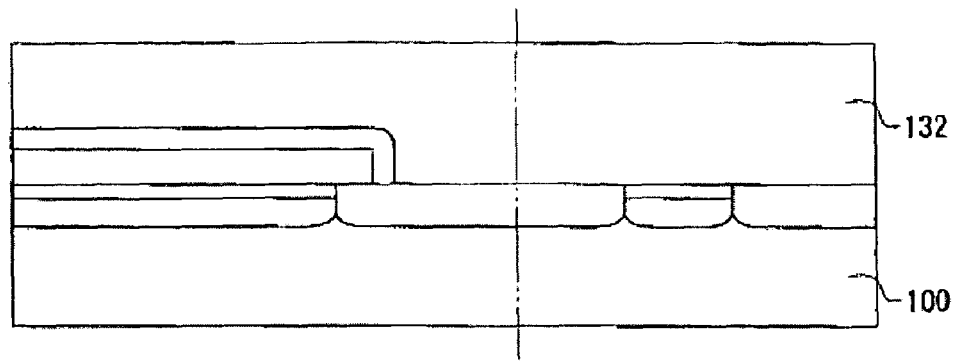
FIG. 3 is a process sectional view depicting a manufacturing process of the semiconductor device according to the first embodiment.
Figure 3:
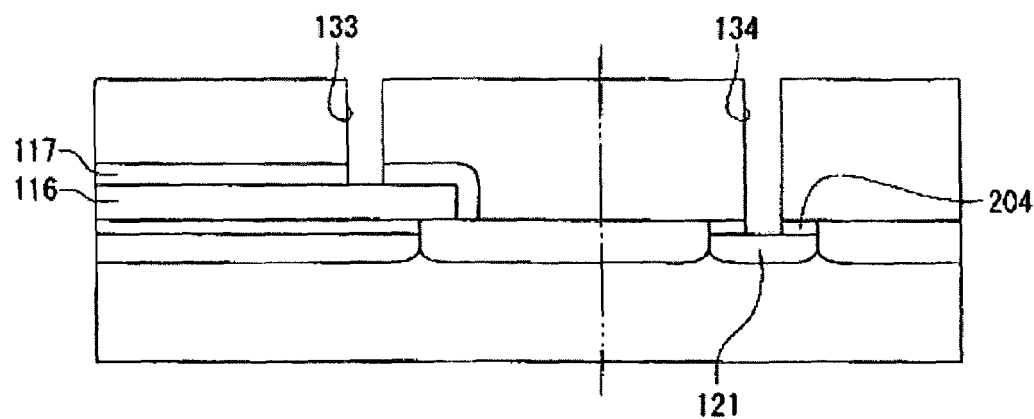
Figure 3:
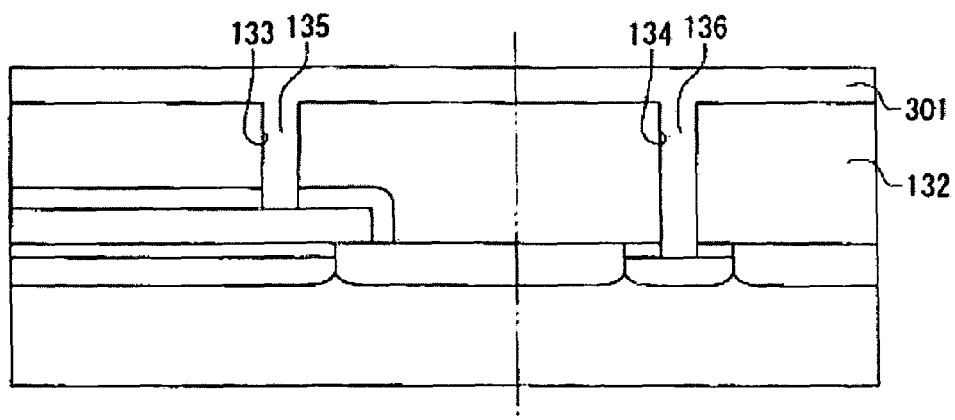

The first embodiment of the present invention will be explained using FIGS. 1 through 3.

Figure 1:
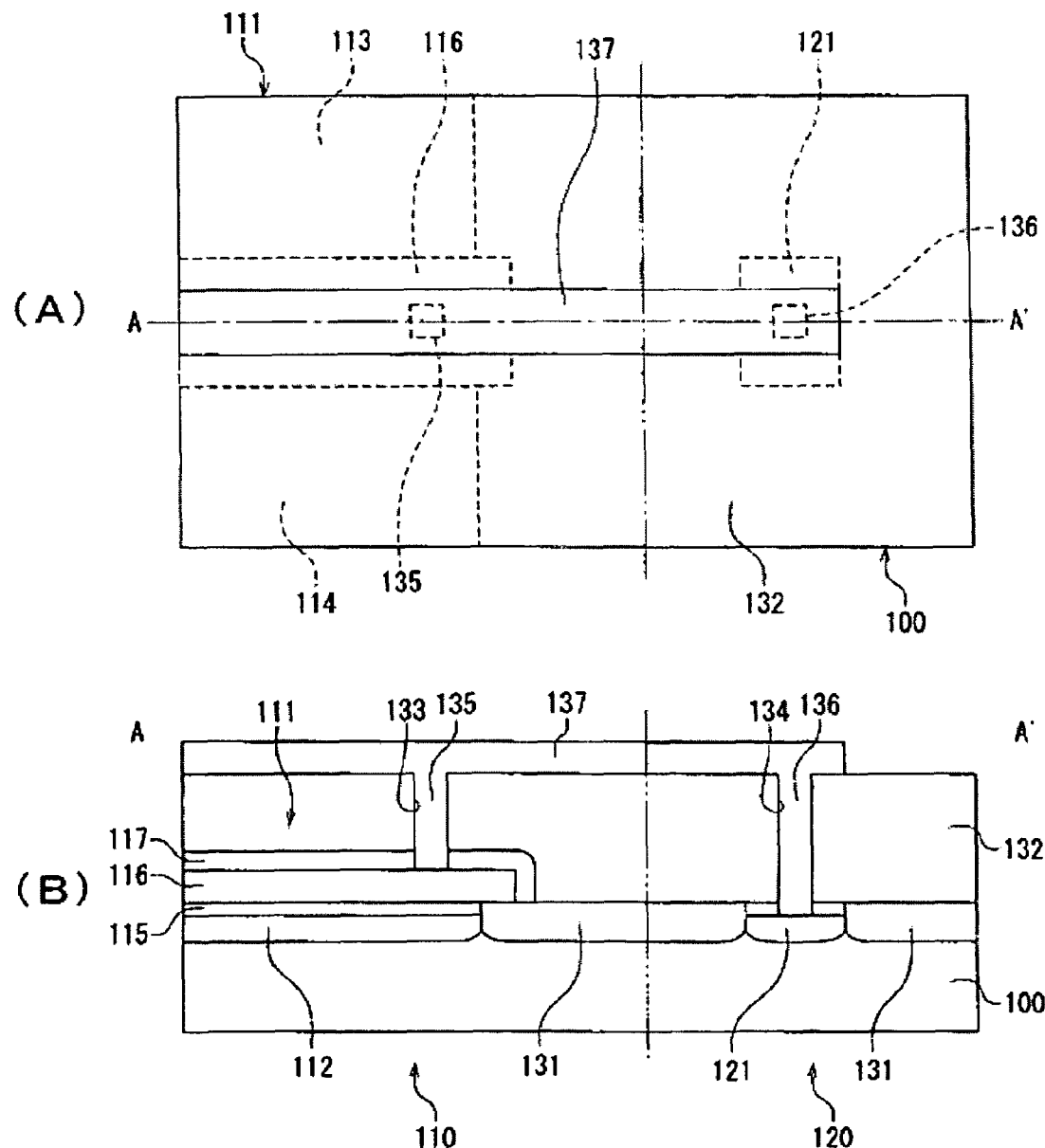
FIG. 1 is a conceptual diagram showing a configuration of a semiconductor integrated circuit according to a first embodiment.

FIG. 1 is a conceptual diagram showing a configuration of a semiconductor integrated circuit according to the present embodiment, wherein FIG. 1(A) is a plan view thereof, and FIG. 1(B) is a sectional view taken along line A-A' of FIG. 1(A), respectively.

As shown in FIG. 1, the surface of a semiconductor substrate 100 is divided or partitioned into a device area 110 and a grid area 120. Device isolation regions 131 are formed in predetermined areas of the device area 110 and the grid area 120. Each of areas in which no device isolation regions 131 are formed serves as a device forming area.

A plurality of MOS transistors and other elements are formed in the device area 110. However, only one MOS transistor 111 is shown in FIG. 1 for simplification of its explanation. The MOS transistor 111 has impurity diffusion regions (source region 113 and drain region 114) formed with a channel forming region 112 interposed therebetween, and a gate insulating film 115 and a gate wiring 116 formed on the channel forming region 112. Further, the MOS transistor 111 has a protective oxide film 117 that covers the upper and side surfaces of the gate insulating film 115 and the gate wiring 116.

On the other hand, a discharge diffusion region 121 is provided in the device forming area of the grid area 120.

An intermediate insulating film 132 is formed over the entire surface of the semiconductor substrate 100. Contact holes 133 and 134 are defined in the intermediate insulating film 132. Interlayer interconnections or wirings 135 and 136 are embedded in the contact holes 133 and 134 respectively. Further, a metal wiring 137 is formed on the surface of the intermediate insulating film 132. The gate wiring 116 and the metal wiring 137 are connected to each other via the interlayer wiring 135. Likewise, the discharge diffusion region 121 and the metal wiring 137 are connected to each other via the interlayer wiring 136. The metal wiring 137 may be connected to the gate, source or drain of another MOS transistor (not shown) or another element (capacitor or the like) via another contact hole or the like (not shown).

Incidentally, as is well known, such a semiconductor integrated circuit as shown in FIG. 1 is formed on the semiconductor substrate 100 and thereafter the grid area 120 is removed by a dicing process (described in later). Accordingly, a semiconductor device obtained as a completed product does not include the discharge diffusion region 121 and the contact hole 134.

A process or method of manufacturing the semiconductor device according to the present embodiment will next be described using the process sectional views of FIGS. 2 and 3.

(1) Device isolation regions 131 are first formed in the surface of a semiconductor substrate 100 using, for example, a LOCOS (Localized Oxidation of Silicon) method or an STI (Shallow Trench Isolation) method or the like. Thus, an area 201 for forming a MOS transistor 111 (refer to FIG. 1) is formed in a device area 110 of the semiconductor substrate 100, and an area 202 for forming a discharge diffusion region 121 is formed in a grid area 120 of the semiconductor substrate 100, respectively (refer to FIG. 2(A)).

(2) An ion implantation protective film 203 is formed in each of the areas 201 and 202 of the semiconductor substrate 100 using, for example, an oxidation method or a diffusion method or the like. Thereafter, an impurity is introduced using, for example, an ion implantation method or the like. Thus, the impurity for controlling the threshold voltage of the MOS transistor 111 is introduced (refer to FIG. 2(B)). Afterwards, the ion implantation protective film 203 is removed by, for example, wet etching or the like.

(3) An oxide film 204 is formed in each of the device forming areas 201 and 202 by, for example, a thermal oxidation method or the like. Thus, a gate insulating film 115 is formed. Further, for example, polysilicon or the like is deposited on the surface of the semiconductor substrate 100 by, for example, a CVD (Chemical Vapor Deposition) method or the like to thereby form a conductive material layer 205 for gate wiring. Further, an oxide layer 206 is formed on the surface of the conductive material layer 205 by, for example, the CVD method or the like (refer to FIG. 2(C)).

(4) The conductive material layer 205 and the oxidation layer 206 are patterned using, for example, a photolithography method or etching method or the like. Thus, a gate wiring 116 and a protective oxide film 117 (refer to FIG. 1) are obtained (refer to FIG. 2(D)).

(5) An impurity is introduced into the semiconductor substrate 100 using, for example, an ion implantation method or the like. Thus, a source region 113 and a drain region 114 of the MOS transistor 111 are formed on a self-alignment basis with the gate wiring 116 and the protective oxide film 117 as masks (refer to FIG. 1(A)). Further, a discharge diffusion region 121 is formed in the device forming area 202 lying in the grid area 120 by this ion introduction (refer to FIG. 2(E)).

(6) An insulating film is formed on the surface of the semiconductor substrate 100 by using the CVD method or the like, for example. Thereafter, the insulating film is planarized using, for example, a CMP (Chemical Mechanical Polishing)

method or the like to thereby obtain an intermediate insulating film 132 (refer to FIG. 3(A)).

(7) Contact holes 133 and 134 are defined or made open using, for example, the photolithography method or etching method or the like (refer to FIG. 3(B)). As shown in FIG. 3(B), the contact hole 133 extends through the protective oxide film 117 to expose the gate wiring 116. The contact hole 134 extends through the oxide film 204 to expose the discharge diffusion region 121.

(8) A metal material such as aluminum or the like is deposited within the contact holes 133 and 134 and on the intermediate insulating film 132 using, for example, the CVD method or sputtering method or the like. Thus, interlayer interconnections or wirings 135 and 136 are formed within the contact holes 133 and 134 respectively, and a metal material layer 301 is formed on the intermediate insulating film 132 (refer to FIG. 3(C)).

(9) Next, the metal material layer 301 formed on the intermediate insulating film 132 is patterned using the photolithography method and the dry etching method to obtain a metal wiring 137. Consequently, such a semiconductor integrated circuit as shown in FIG. 1 is obtained.

Here, the metal material layer 301 is connected not only to the gate wiring 116 but also to the discharge diffusion region 121 (refer to FIG. 3(C)). Thus, when the metal material layer 301 is patterned by the dry etching method, most of electric charges introduced into the metal material layer 301 can be discharged to the discharge diffusion region 121. Therefore, the amount of electric charges that reach the gate insulating film 115 upon such dry etching is so reduced. Thus, the manufacturing process according to the present embodiment is capable of reducing etching damage at the time of formation of the metal wiring 137.

(10) After the formation of the surface protective film and the like, respective semiconductor chips are cut out from the semiconductor substrate 100 by a dicing process. At this time, the grid area 120 is cut off and hence only the device area 110 remains.

Since the discharge diffusion region 121 and the contact hole 134 are formed within the grid area 120 in the present embodiment, the discharge diffusion region 121 and the contact hole 134 do not remain in each individual semiconductor chip obtained by the dicing process. Thus, according to the present embodiment, the formation of the discharge diffusion region 121 and the contact hole 134 will not cause an increase in chip area.

(11) Thereafter, a semiconductor device is completed via a packaging process or the like.

Since the metal wiring 137 (metal material layer 301) and the discharge diffusion region 121 are connected to each other via the contact hole 134 in the present embodiment as described above, the etching damage at the time of formation of the metal wiring 137 by the dry etching method can be reduced.

Since the discharge diffusion region 121 and the contact hole 134 are formed within the grid area 120 in the present embodiment, the chip area of the semiconductor device does not increase.

Since the discharge diffusion region 121 and the contact hole 134 are formed within the grid area 120 (that is, shot area) in the present embodiment in addition to above, the present embodiment does not cause an increase in the number of exposure process steps as in the case (refer to the patent document 1) where the discharging circuit is formed within the non-shot area, thus making it possible to suppress the cost of manufacturing low.

Second Preferred Embodiment

A second embodiment of the present invention will next be explained using FIGS. 4 and 5.

Figure 4:
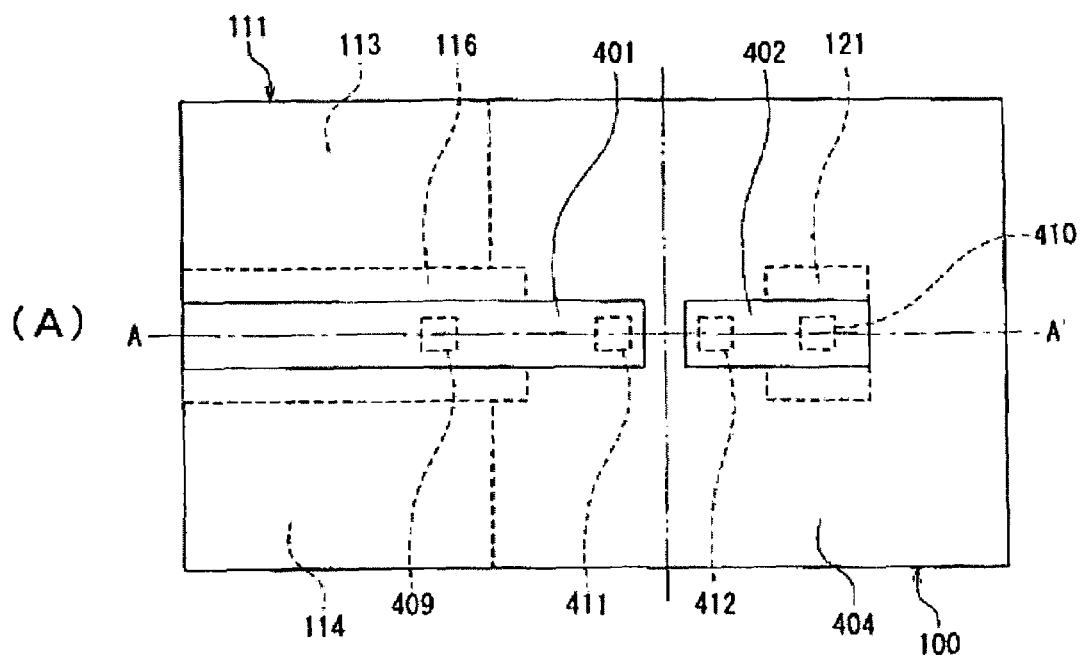
FIG. 4 is a conceptual diagram showing a configuration of a semiconductor integrated circuit according to a second embodiment.
Figure 4:
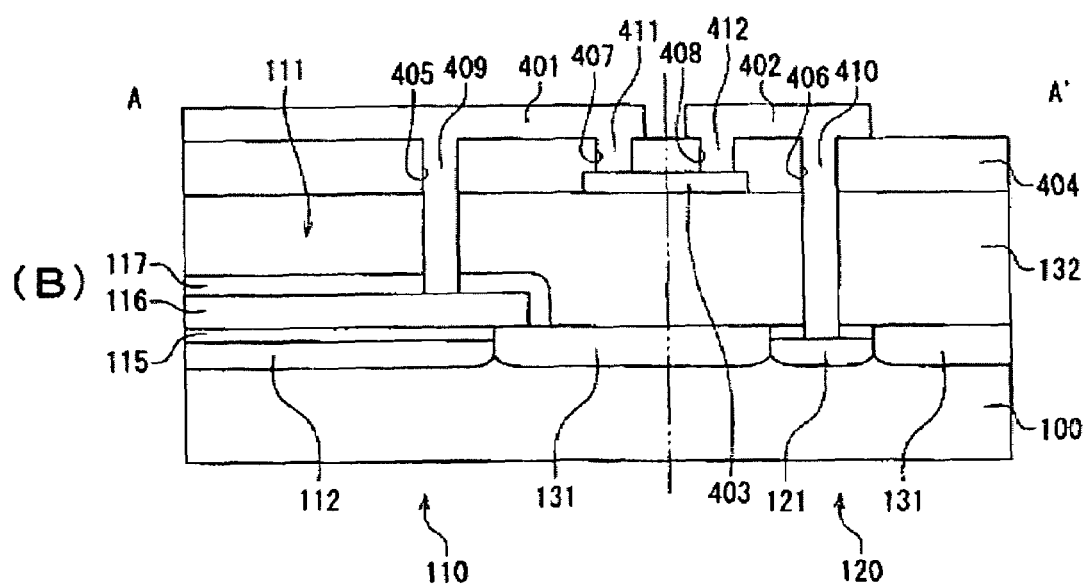
Figure 5:
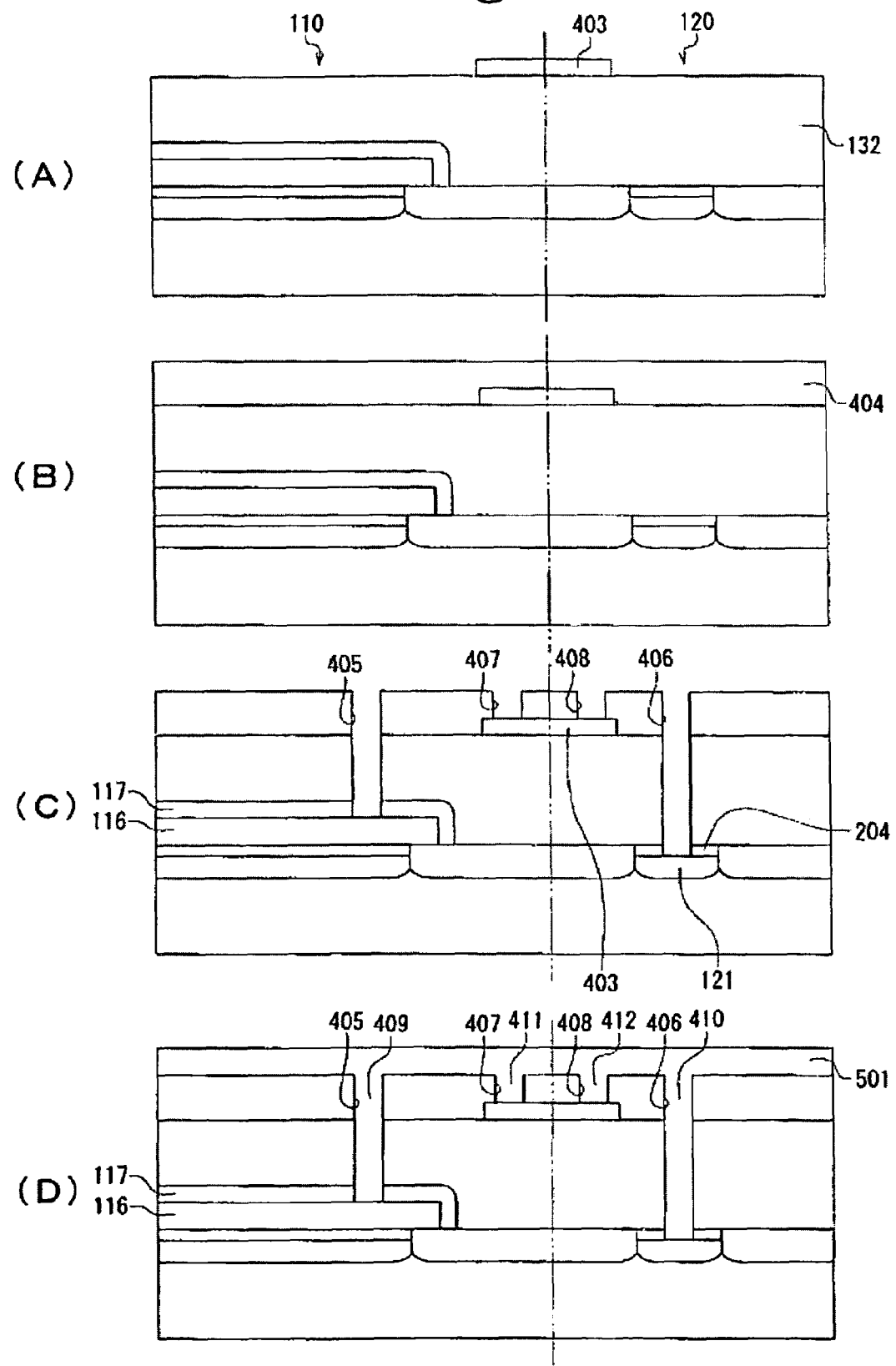
FIG. 5 is a process sectional view illustrating a manufacturing process of a semiconductor device according to the second embodiment.

FIG. 4 is a conceptual diagram showing a configuration of a semiconductor integrated circuit according to the present embodiment, wherein FIG. 4(A) is a plan view thereof, and FIG. 4(B) is a sectional view taken along line A-A' of FIG. 4(A), respectively. In FIG. 4, constituent elements marked with the same reference numerals as those shown in FIG. 1 respectively indicate the same ones as those shown in FIG. 1.

In the semiconductor integrated circuit according to the present embodiment, as shown in FIG. 4, wiring patterns are formed using metal wirings 401 and 402 and a nonmetal wiring 403.

The non-metallic wiring 403 is formed on an intermediate insulating film 132 so as to straddle a device area 110 and a grid area 120. For instance, polysilicon can be used as a material for forming the nonmetal wiring 403. An interlayer insulating film 404 is formed on the intermediate insulating film 132. Contact holes 405 and 406 are formed so as to extend through the intermediate insulating film 132 and the interlayer insulating film 404, and contact holes 407 and 408 are formed in the interlayer insulating film 404. Interlayer wirings 409, 410, 411 and 412 are respectively embedded in the contact holes 405, 406, 407 and 408. A gate wiring 116 and the metal wiring 401 are connected to each other through the interlayer wiring 409, and a discharge diffusion region 121 and the metal wiring 402 are connected to each other through the interlayer wiring 410. Further, the metal wirings 401 and 402 and the nonmetal wiring 403 are connected to one another through the interlayer wirings 411 and 412.

Incidentally, the metal wiring 401 may be connected to the gate, source or drain of another MOS transistor (not shown) or another element (capacitor or the like) via another contact hole or the like (not shown).

A process or method of manufacturing a semiconductor device according to the present embodiment will next be explained using the process sectional view of FIG. 5.

(1) In a manner similar to the first embodiment referred to above, device isolation regions 131 are formed in the surface of a semiconductor substrate 100 and a threshold-voltage control impurity is introduced. Thereafter, a gate insulating film 115, a gate wiring 116, a protective oxide film 117, a source region 113, a drain region 114, a discharge diffusion region 121, and an intermediate insulating film 132 are formed sequentially (refer to the process steps (1) through (6), FIGS. 2(A) through 2(E) and FIG. 3).

(2) Subsequently, a nonmetal conductive material (e.g., polysilicon) is deposited on the intermediate insulating film 132 using, for example, a CVD method or the like. And the nonmetal material layer is patterned using, for example, a photolithography method or etching method or the like thereby to obtain a nonmetal wiring 403 (refer to FIG. 5(A)).

(3) An insulating film is formed on the surface of the intermediate insulating film 132 by using the CVD method or the like, for example. Thereafter, the insulating film is planarized using a CMP method or the like, for example, thereby to obtain an interlayer insulating film 404 (refer to FIG. 5(B)).

(4) Contact holes 405 through 408 are defined or made open using, for example, the photolithography method or etching method or the like (refer to FIG. 5(C)). As shown in FIG. 5(C), the contact hole 405 extends through the protective oxide film 117 to expose the gate wiring 116. The contact hole 406 extends through an oxide film 204 to expose the discharge diffusion region 121. Also, the contact holes 407 and 408 expose the nonmetal wiring 403.

(5) A metal material such as aluminum or the like is deposited within the contact holes 405 through 408 and on the interlayer insulating film 404 using, for example, the CVD method or sputtering method or the like. Thus, interlayer wirings 409 through 412 are formed within the contact holes 405 through 408, and a metal material layer 501 is formed on the intermediate insulating film 132 (refer to FIG. 5(D)).

(6) Next, the metal material layer 501 formed on the interlayer insulating film 404 is patterned using the photolithography method and dry etching method to obtain metal wirings 401 and 402. Consequently, such a semiconductor integrated circuit as shown in FIG. 4 is obtained.

In a manner similar to the first embodiment referred to above, the metal material layer 501 is connected not only to the gate wiring 116 but also to the discharge diffusion region 121. Thus, when the metal material layer 501 is patterned by the dry etching method, the amount of electric charges stored in the gate insulating film 115 is considerably reduced. Thus, according to the manufacturing process of the present embodiment, it is possible to reduce etching damage at the time of formation of the metal wiring 401.

(7) After the formation of the surface protective film and the like, respective semiconductor chips are cut out from the semiconductor substrate 100 by a dicing process. At this time, the grid area 120 is cut off and hence only the device area 110 remains.

Since the discharge diffusion region 121 and the contact holes 406 and 408 are formed within the grid area 120 even in the present embodiment in a manner similar to the first embodiment, the discharge diffusion region 121 and the contact holes 406 and 408 do not remain in each individual semiconductor chip obtained by the dicing process. Thus, the discharge diffusion region 121 and the contact holes 406 and 408 will not cause an increase in chip area.

In the present embodiment, the nonmetal wiring 403 is cut off by the dicing process and thereby exposed from the side face of the chip. That is, the cut surface of the metal wiring 401 is not exposed after the dicing process in the present embodiment. Therefore, there is also no fear of corrosion of the metal wiring 401.

(8) Thereafter, a semiconductor device is completed via a packaging process or the like.

Since the metal wiring 401 (metal material layer 501) and the discharge diffusion region 121 are connected to each other via the nonmetal wiring 403 and the contact holes 406 through 408 in the present embodiment as described above, etching damage at the time of formation of the metal wiring 401 by the dry etching method can be reduced.

Since the discharge diffusion region 121 and the contact holes 406 and 408 are formed within the grid area 120 in the present embodiment, the chip area of the semiconductor device does not increase.

In addition to above, the discharge diffusion region 121 and the contact holes 406 and 408 are formed within the grid area 120 (that is, shot area). Therefore, this will not cause an increase in the number of exposure process steps as in the case (refer to the patent document 1) where the discharging circuit is formed within the non-shot area, thus making it possible to suppress the cost of manufacturing low.

Further, since the nonmetal wiring 403 is used for wiring at the boundary between the device area 110 and the grid area 120 in the present embodiment, there is no fear that metal corrosion occurs from the wiring exposed by the dicing process.

While the preferred forms of the present invention have been described, it is to be understood that modifications will be apparent to those skilled in the art without departing from the spirit of the invention. The scope of the invention is to be determined solely by the following claims.

What is claimed is:

1. A process for manufacturing a semiconductor device, comprising:
    forming a field effect transistor in a device area of a surface of a semiconductor substrate and forming a discharge high-concentration impurity region in a grid area of the surface of the semiconductor substrate;
    forming an intermediate insulating film over the semiconductor substrate;
    forming a wiring pattern using a dry etching method, the wiring pattern connected to a gate electrode of the field effect transistor through a first contact hole provided in the intermediate insulating film placed over the device area and connected to the discharge high-concentration impurity region through a second contact hole provided in the intermediate insulating film placed over the grid area; and
    cutting the semiconductor substrate at a boundary between the device area and the grid area, to remove the grid area of the semiconductor substrate from the device area of the semiconductor substrate,
    wherein said forming a wiring pattern further includes
        forming a region-to-region wiring pattern of a non-metal conductive material as extending over the device area and the grid area,
        forming an interlayer insulating film over the intermediate insulating film,
        etching the intermediate insulating film and the interlayer insulating film to thereby form the first contact hole over the gate electrode and the second contact hole over the discharge high-concentration impurity region, and etching the interlayer insulating film to form a third contact hole over the region-to-region wiring lying in the device area and a fourth contact hole over the region-to-region wiring lying in the grid area,
        depositing a conductive material layer within the first through fourth contact holes and over the interlayer insulating film, and
        processing the conductive material layer provided over the interlayer insulating film using the dry etching method, to thereby form in-region wiring patterns between the first and third contact holes and between the second and fourth contact holes.

2. A process for manufacturing a semiconductor device comprising:
    forming a field effect transistor in a device area of a semiconductor substrate;
    forming a discharge impurity region in a grid area of the semiconductor substrate;
    forming a first insulating layer over the semiconductor substrate;
    forming a wiring pattern connected to a gate of the field effect transistor and the discharge impurity region through the first insulating layer by a dry etching process; and
    dicing the semiconductor substrate at a boundary between the device area and the grid area, to remove the grid area of the semiconductor substrate and to provide a semiconductor chip including the device area of the semiconductor substrate,
    wherein said forming a wiring pattern includes
        forming a non-metal layer conductive pattern on the first insulating layer that extends from over the device area to over the grid area, forming a second insulating layer over the non-metal conductive pattern and the first insulating layer, etching first and second contact holes through the first and second insulating layers that respectively expose the gate and the discharge impurity region, and third and fourth contact holes through the second insulating layer to expose first and second ends of the non-metal conductive pattern at respective positions over the device area and the grid area, forming a metal layer on the second insulating layer and in the first, second, third and fourth contact holes, and patterning the metal layer into the wiring pattern using the dry etching process.

* * * * *